United States Patent
Gabrielsson

(10) Patent No.: US 11,422,161 B2
(45) Date of Patent: Aug. 23, 2022

(54) CURRENT SENSING CIRCUIT AND CURRENT MEASURING SYSTEM FOR MEASURING A CURRENT IN AN ELECTRICAL LINE

(71) Applicant: Webasto Charging Systems, Inc., Monrovia, CA (US)

(72) Inventor: Peter Gabrielsson, Monrovia, CA (US)

(73) Assignee: WEBASTO CHARGING SYSTEMS, INC., Monrovia, CA (US)

( * ) Notice: Subject to any disclaimer, the term of this patent is extended or adjusted under 35 U.S.C. 154(b) by 33 days.

(21) Appl. No.: 17/124,322

(22) Filed: Dec. 16, 2020

(65) Prior Publication Data

US 2022/0187343 A1 Jun. 16, 2022

(51) Int. Cl.
*B60L 53/10* (2019.01)
*G01R 15/14* (2006.01)
*B60L 3/00* (2019.01)

(52) U.S. Cl.
CPC .......... *G01R 15/146* (2013.01); *B60L 3/0069* (2013.01); *B60L 53/10* (2019.02)

(58) Field of Classification Search
None
See application file for complete search history.

(56) References Cited

U.S. PATENT DOCUMENTS

| | | | |
|---|---|---|---|
| 6,984,979 B1 * | 1/2006 | Edel | G01R 15/185 324/253 |
| 8,633,678 B2 | 1/2014 | Yegin et al. | |
| 9,969,277 B2 | 5/2018 | Williams et al. | |
| 2009/0219009 A1 | 9/2009 | Jansen et al. | |
| 2012/0091957 A1 * | 4/2012 | Masuda | B60L 3/0069 320/109 |
| 2015/0160298 A1 * | 6/2015 | Tabatowski-Bush | G01R 27/2611 324/426 |
| 2017/0349056 A1 | 12/2017 | Jang et al. | |

OTHER PUBLICATIONS

International Search Report and Written Opinion for PCT/US2021/060134, dated Mar. 16, 2022.

* cited by examiner

*Primary Examiner* — Patrick Assouad
*Assistant Examiner* — Haidong Zhang
(74) *Attorney, Agent, or Firm* — Concept IP LLP; Michael Zarrabian

(57) ABSTRACT

A current sensing circuit is provided for measuring a current in an electrical line connecting an electrical supply to a load. The current sensing circuit includes a magnetic circuit having: a magnetic core, a reference winding wound around the magnetic core, and a conductor passing through center of the magnetic core. The conductor is being connected to the electrical line. The current sensing circuit further includes a detection circuit connected to the reference winding of the magnetic circuit. The detection circuit is configured to detect a change in condition of the magnetic core and generate a detection signal in response to determination of the change. Furthermore, the current sensing circuit includes a controller coupled to the detection circuit for receiving the detection signal. The controller measures the current in the electrical line in response to the detection signal from the detection circuit.

13 Claims, 16 Drawing Sheets

CURRENT SENSING CIRCUIT AND CURRENT MEASURING SYSTEM FOR MEASURING A CURRENT IN AN ELECTRICAL LINE

TECHNICAL FIELD

Embodiments relate generally to measuring systems, and more particularly to a current sensing circuit used in the measuring systems for measuring a current in an electrical line.

BACKGROUND

There are various measuring systems for measuring current in an electrical line. Conventional measuring systems use current sensing technologies such as a hall-effect, a fluxgate, or a current transformer technology for measuring the current in the electrical line. However, these current sensing technologies have some drawbacks when used in measuring systems to measure the current in the electrical line. For example, the hall-effect technology requires a hall element (e.g. a magnetic-electric converting element) to measure the current in the electrical line, which makes the hall-effect technology expensive. Further, the hall-effect current sensing technology is more sensitive to temperature changes.

The fluxgate technology requires a magnetic probe coil to measure the current in the electrical line, which makes the implementation of the fluxgate technology to be complex, and expensive.

The current transformer technology neither uses the hall element nor the magnetic probe coil. However, a measuring system that uses the current transformer technology requires a larger circuit board, as the current transformer is large and occupies more space on the circuit board to measure the current in the electrical line. As the size of the circuit board increases, the cost for manufacturing the circuit board also increases. Therefore, the current transformer is expensive to implement in the measuring systems.

SUMMARY

A circuit embodiment may include a current sensing circuit for measuring a current in an electrical line connecting an electrical supply to a load. The current sensing circuit may include a magnetic circuit having a magnetic core, a reference winding wound around the magnetic core, and a conductor passing through the center of the magnetic core, the conductor being connected to the electrical line; a detection circuit connected to the reference winding of the magnetic circuit, wherein the detection circuit is configured to detect a change in condition of the magnetic core and generate a detection signal in response to determination of the change; and a controller coupled to the detection circuit for receiving the detection signal, wherein the controller is configured to measure the current in the electrical line in response to receiving the detection signal from the detection circuit.

In additional current sensing circuit embodiments, the condition of the magnetic core is at least one of a saturation condition and a desaturated condition.

In additional current sensing circuit embodiments, the detection circuit may further comprise: a current source circuit configured to supply reference current to the reference winding to bias the condition of the magnetic core, wherein the condition of the magnetic core (203b) changes to at least one of the saturation condition and the desaturated condition, based on the reference current and the current in the electrical line; and a comparator circuit configured to detect a voltage pulse across the reference winding and generate the detection signal in response to the detected voltage pulse, wherein the voltage pulse is generated when the condition of the magnetic core changes from saturated condition to desaturated condition.

In additional current sensing circuit embodiments, the controller is further configured to: sample the reference current in response to the detection signal; determine a phase time for each of sampled values of the reference current; sort the sampled values of the reference current, based on the determined phase time; and calculate an average value, based on the sorted sampled values of the reference current. The calculated average value is proportional to the current in the conductor connected to the electrical line.

In additional current sensing circuit embodiments, the magnetic core of toroidal shape comprises: a predefined inner diameter, and a predefined outer diameter. The reference winding is wound to the magnetic core for a predefined number of turns.

In additional current sensing circuit embodiments, the comparator circuit generates the detection signal when the detected voltage pulse is greater than a threshold value.

In additional current sensing circuit embodiments, the controller is configured to control the current source circuit to adjust the reference current using at least one of scale-up settings and scale-down settings.

In additional current sensing circuit embodiments, the scale-up settings comprises a predefined ampere of the reference current to be scaled-up at a frequency range between hundred millisecond to about ten millisecond; and the scale-down settings comprises a predefined ampere of the reference current to be scaled-down at a frequency range between hundred millisecond to about ten millisecond.

A method embodiment may include a method for measuring a current in an electric line connecting an electrical supply to a load. The method may include: supplying a reference current to a reference winding, wherein the reference winding is wound around a magnetic core; detecting a change in condition of the magnetic core, based on the supplied reference current and generating a detection signal in response to determination of the change; and measuring the current in the electrical line in response to the detection signal, wherein the detection signal is indicative of the change in the condition of the magnetic core.

In additional method embodiments, the condition of the magnetic core is at least one of a saturation condition and a desaturated condition.

In additional method embodiments, the method further comprises adjusting the reference current using at least one of scale-up settings and scale-down settings.

In additional method embodiments, the scale-up settings comprises a predefined ampere of the reference current to be scaled-up at a frequency range between hundred millisecond to ten millisecond; and the scale-down settings comprises a predefined ampere of the reference current to be scaled-down at a frequency range between hundred millisecond to ten millisecond.

In additional method embodiments, the method further comprises detecting a voltage pulse across the reference winding. The voltage pulse is generated when the condition of the magnetic core changes from a saturated condition to a desaturated condition.

In additional method embodiments, the method further comprises sampling the reference current in response to the detection signal; determining a phase time for each of sampled values of the reference current; sorting the sampled values of the reference current, based on the determined phase time; and calculating an average value, based on the sorted sampled values of the reference current, wherein the calculated average value is proportional to the current in the conductor connected to the electrical line.

In yet another aspect, an electric vehicle supply equipment (EVSE) may include: a current sensing circuit for measuring a current in an electrical line connecting an electrical supply to a load, the current sensing circuit may include: a magnetic circuit having a magnetic core, a reference winding wound around the magnetic core, and a conductor passing through center of the magnetic core, the conductor being connected to the electrical line; a detection circuit connected to the reference winding of the magnetic circuit, wherein the detection circuit is constructed and arranged to detect a change in condition of the magnetic core; and a controller coupled to the detection circuit, wherein the controller is configured to measure the current in the electrical line in response to a detection signal from the detection circuit.

In additional EVSE embodiments, the EVSE may include an overcurrent protection circuit configured to prevent excessive current from flowing to the EVSE wherein the overcurrent protection circuit is configured to operate in response to the measured current from the current sensing circuit.

In additional EVSE embodiments, the overcurrent protection circuit is further configured to: determine whether the measured current from the current sensing circuit is greater than a configurable threshold supply current; and interrupt the flow of the current in the EVSE, in response to determining the current in the electrical line is greater than the configurable threshold supply current.

In additional EVSE embodiments, the condition of the magnetic core is at least one of a saturation condition and a desaturated condition.

In additional EVSE embodiments, the detection circuit may further comprise: a current source circuit configured to supply reference current to the reference winding to bias the condition of the magnetic core, wherein the condition of the magnetic core (203b) changes to at least one of the saturation condition and the desaturated condition, based on the reference current and the current in the electrical line; and a comparator circuit configured to detect a voltage pulse across the reference winding and generate the detection signal in response to the detected voltage pulse, wherein the voltage pulse is generated when the condition of the magnetic core changes from saturated condition to desaturated condition.

In additional EVSE embodiments, the comparator circuit generates the detection signal when the detected voltage pulse is greater than a threshold value.

In additional EVSE embodiments, the controller is configured to control the current source circuit to adjust the reference current using at least one of scale-up settings and scale-down settings.

In additional EVSE embodiments, the scale-up settings comprises a predefined ampere of the reference current to be scaled-up at a frequency range between hundred millisecond to ten milliseconds; and the scale-down settings comprises a predefined ampere of the reference current to be scaled-down at a frequency range between hundred millisecond to ten milliseconds.

In additional EVSE embodiments, the controller is further configured to: sample the reference current in response to the detection signal; determine a phase time for each of sampled values of the reference current; sort the sampled values of the reference current, based on the determined phase time; and calculate an average value, based on the sorted sampled values of the reference current. The calculated average value is proportional to the current in the conductor connected to the electrical line.

In additional EVSE embodiments, the magnetic core comprises: a predefined inner diameter, and a predefined outer diameter. The reference winding is wound to the magnetic core for a predefined number of turns.

In additional EVSE embodiments, the predefined inner diameter is eight millimeter, the predefined outer diameter is thirteen millimeter, and the predefined number of turns is two hundred and fifty turns.

A system embodiment may include an electric vehicle supply system. The system may include: a current sensing circuit for measuring a current in an electrical line connecting an electrical supply to a load, the current sensing circuit may include: a magnetic circuit having a magnetic core, a reference winding wound around the magnetic core, and a conductor passing through center of the magnetic core, the conductor being connected to the electrical line; a detection circuit connected to the reference winding of the magnetic circuit, wherein the detection circuit is constructed and arranged to detect a change in condition of the magnetic core and generate a detection signal in response to determination of the change; and a controller coupled to the detection circuit for receiving the detection signal, wherein the controller is configured to measure the current in the electrical line in response to the detection signal from the detection circuit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

The present current sensing circuit allows for accurately measuring a current in an electrical line by supplying a reference current to a magnetic circuit having a magnetic core. The reference current is supplied to bias a condition of the magnetic core. The condition of the magnetic core changes to a saturated condition based on the reference current and the current in the electrical line. For instance, the magnetic core changes to the saturated condition when a delta between the reference current and the current in the electrical line is exceeding a saturation current of the magnetic core. Further, the magnetic core changes from the saturated condition to a desaturated condition when the reference current is equal to the current in the electrical line. To that end, the reference current is sampled to accurately measure the current in the electrical line, as the reference current is equal to the current in the electrical line when the magnetic core changes from the saturated condition to the desaturated condition.

The magnetic core is normally kept in the saturated condition for measuring the current in the electrical line, the magnetic core used in the magnetic circuit has small dimensions when compared with magnetic cores used in currently available current sensing technology and further, the magnetic core used in the magnetic circuit may be made of low cost soft saturating materials. Further, the present current sensing circuit may not be affected by temperature changes. For instance, the present current sensing circuit allows for accurately measuring the current in the electrical line for a wide range of temperatures (e.g. −40 degrees Celsius to +120 degrees Celsius). Furthermore, the present current sensing circuit has a better Electro-Magnetic Compatibility (EMC) performance than the currently available current sensing technology, as the present current sensing circuit uses the magnetic core that is in the saturated condition for measuring the current in the electrical line.

Figure 1:
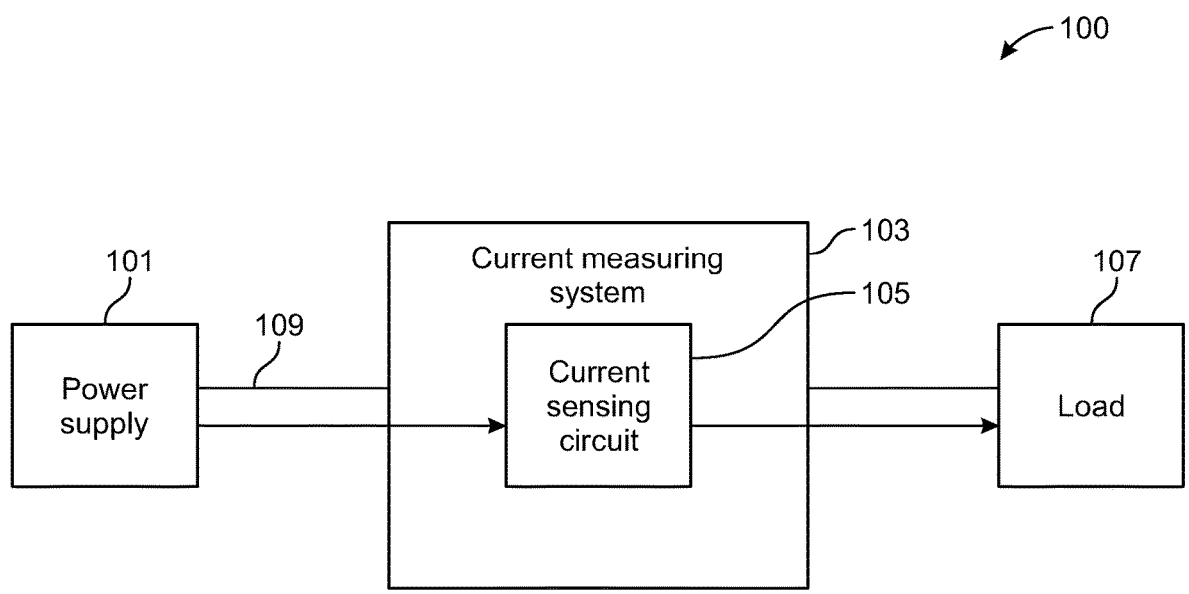
FIG. 1 depicts an environment of a current measuring system for measuring a current in an electrical line, in accordance with an example embodiment of the present invention.

FIG. 1 depicts an environment 100 of a current measuring system 103 for measuring a current in an electrical line 109, in accordance with an example embodiment of the present invention. The current measuring system 103 is connected to the electrical line 109. The electrical line 109 connects a power supply 101 to a load 107. The power supply 101 supplies an electric power to the load 107 via the electrical line 109. For instance, the power supply 101 may be a utility grid or the like. The power supply 101 may also be referred to as an electrical supply 101. The electric power may be an alternating current (AC) supply, for instance, a sinusoidal current or a direct current (DC) supply. The current measuring system 103 is configured to measure the AC supply (i.e. the current) in the electrical line 109.

In an embodiment, the current measuring system 103 includes a current sensing circuit 105 for measuring the current in the electrical line 109. To that end, the current sensing circuit 105 is connected to the electrical line 109 and configured to measure the current in the electrical line 109 connecting the power supply 101 to the load 107. Some embodiments are based on the realization that the current in the electrical line 109 does not change instantaneously. To that end, in an example embodiment, the current sensing circuit 105 is configured to measure an average value of the current (such as Root Mean square (RMS) value of the current) in the electrical line 109 rather than measuring the instantaneous current. For instance, the current sensing circuit 105 measures the average value of the current flowing in the electrical line 109 for a predefined period. The current sensing circuit 105 used in the current measuring system 103 for measuring the current in the electrical line 109 is further explained in the detailed description of FIG. 2A.

Figure 2A:
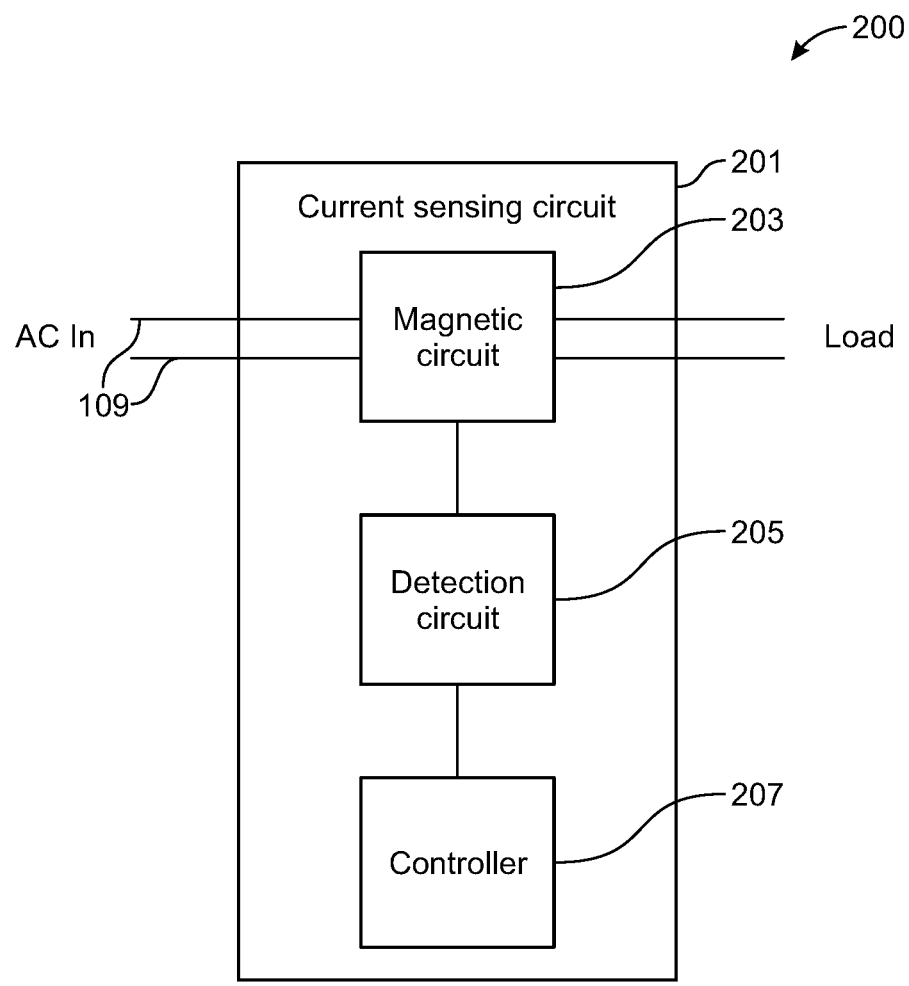
FIG. 2A depicts a generic block diagram of a current sensing circuit for measuring the current in the electrical line, in accordance with an example embodiment of the present invention.

FIG. 2A depicts a generic block diagram 200 of a current sensing circuit 201 for measuring the current in the electrical line 109, in accordance with an example embodiment of the present invention. The current sensing circuit 201 corresponds to the current sensing circuit 105 explained in the detailed description of FIG. 1. The current sensing circuit 201 includes a magnetic circuit 203, a detection circuit 205, and a controller 207. The magnetic circuit 203 used in the current sensing circuit 201 is as shown in FIG. 2B.

Figure 2B:
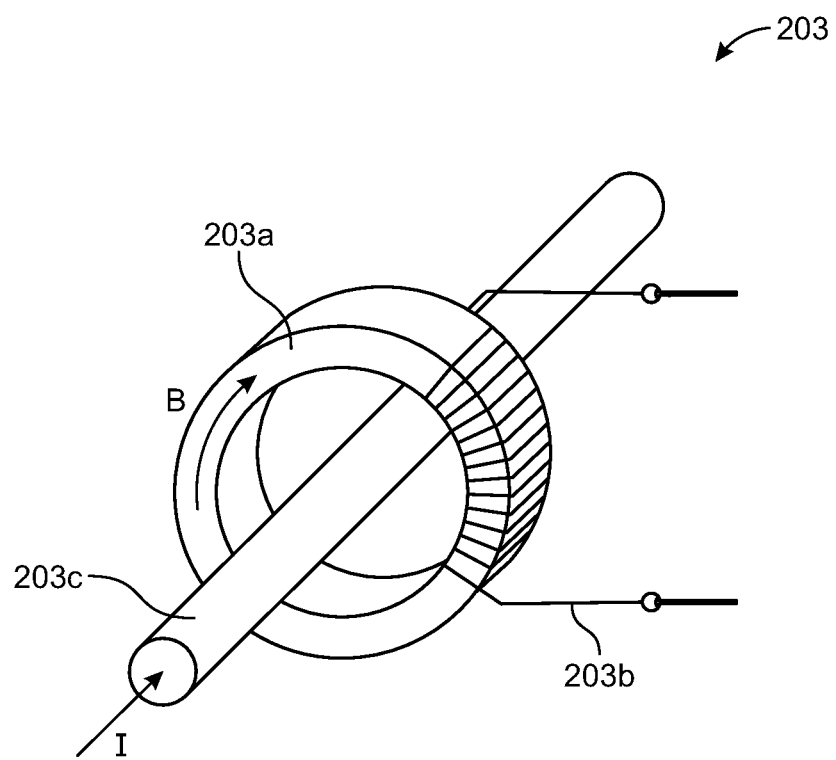
FIG. 2B depicts an exemplary magnetic circuit used in the current sensing circuit, in accordance with an example embodiment of the present invention.

FIG. 2B depicts an exemplary magnetic circuit 203 used in the current sensing circuit 201, in accordance with an example embodiment of the present invention. The magnetic circuit 203 includes a magnetic core 203a, a reference winding 203b wound on the magnetic core 203a, and a conductor 203c passing through the center of the magnetic core 203a. The magnetic core 203a is a toroidal shaped magnetic core. For instance, the magnetic core 203a is the toroidal shaped magnetic core of a soft saturating material or a hard saturating material. The soft saturating materials may include a ferrite core, a soft iron-nickel alloy, or the like. The hard saturating materials may include chromium steel, tungsten steel, or the like.

The magnetic core 203a has a predefined inner diameter and a predefined outer diameter. For instance, the magnetic core 203a has an inner diameter of about eight millimeters and an outer diameter of about thirteen millimeters. The magnetic core 203a is wound with the reference winding 203b for a predefined number of turns. For instance, the predefined number of turns on the magnetic core 203a is about two hundred and fifty turns in one embodiment.

Further, the magnetic core 203a allows the conductor 203c to pass through the center of the magnetic core 203a. The conductor 203c is connected to the electrical line 109 that connects the power supply 101 to the load 107. In an example embodiment, the conductor 203c may be the electrical line 109 that connects the power supply 101 to the load 107.

Referring to FIG. 2A, the detection circuit 205 is connected to the magnetic circuit 203a. In an embodiment, the detection circuit 205 is connected to the reference winding 203b of the magnetic circuit 203a. The detection circuit 205 is constructed and arranged to detect a change in condition of the magnetic core 203a. The condition of the magnetic core 203a is at least one of a saturated condition and a desaturated condition. As used herein, the saturated condition is a condition that the magnetic core 203a may not induce a magnetic field for any change in the current in the conductor 203c. As used herein, the desaturated condition is a condition that the magnetic core 203a induces a magnetic field proportional to change in the current in the conductor 203c. In an embodiment, the detection circuit 205 is configured to detect whether the magnetic core 203a changes from the saturated condition to the desaturated condition. Further, the detection circuit 205 is configured to generate a detection signal in response to detecting the change in the condition of the magnetic core 203a. The detection signal is indicative of the change in the condition of the magnetic core 203a.

The controller 207 is coupled to the detection circuit 205. In one embodiment, the controller 207 is a microcontroller-based circuit. The controller 207 is configured to measure the current in the electric line 109 in response to the generation of the detection signal from the detection circuit 205. The detection circuit 205 and the controller 207 used in the current sensing 201 is further explained in the detailed description of FIG. 3.

Figure 3:
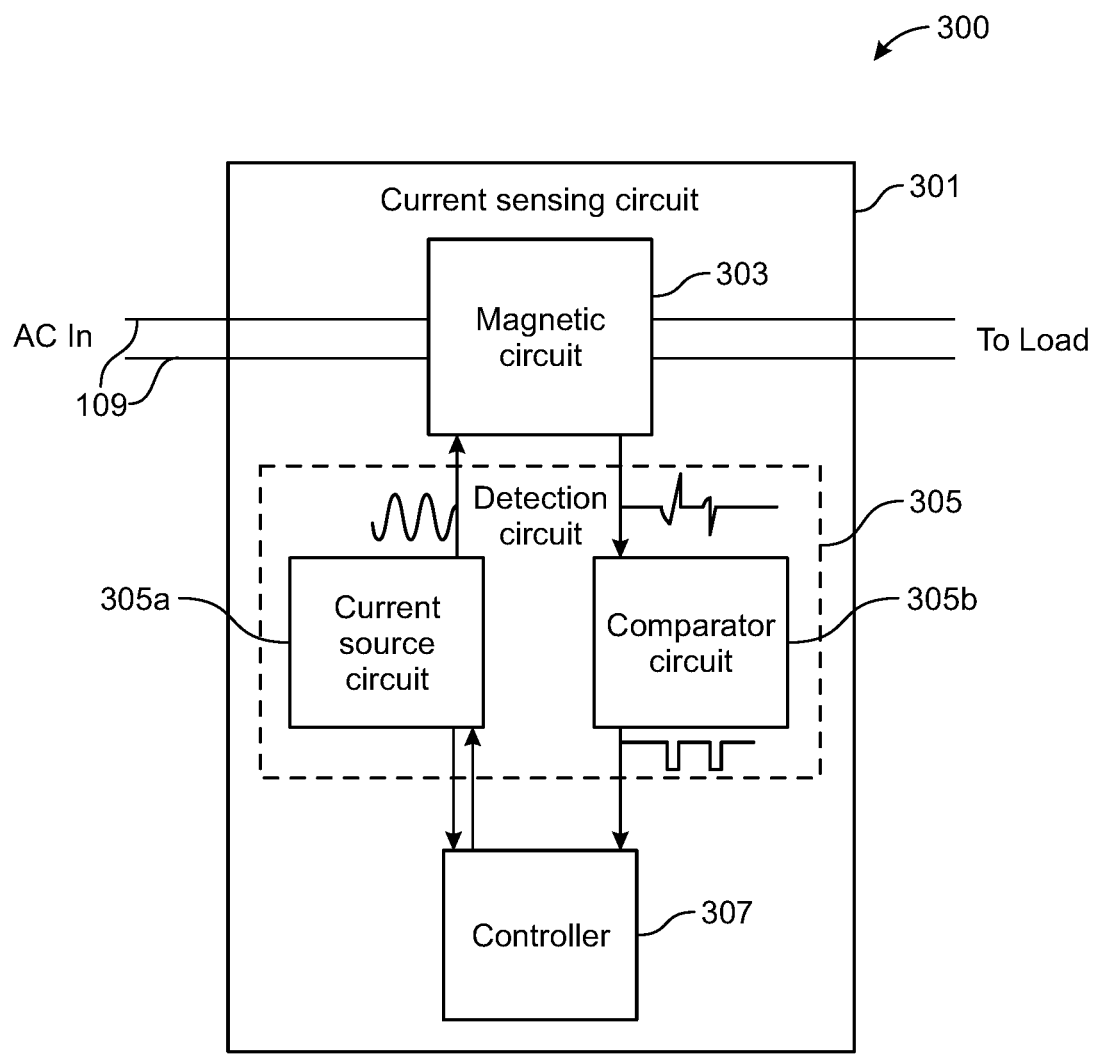
FIG. 3 depicts a detailed block diagram of the current sensing circuit for measuring the current in the electrical line, in accordance with an example embodiment of the present invention.

FIG. 3 depicts a detailed block diagram 300 of the current sensing circuit 301 for measuring the current in the electrical line 109, in accordance with an example embodiment of the present invention. The current sensing circuit 301 corresponds to the current sensing circuit 201 explained in the detailed description of FIG. 2A. The current sensing circuit 301 includes a magnetic circuit 303, a detection circuit 305, and a controller 307. The magnetic circuit 303, the detection circuit 305, and the controller 307 correspond to the magnetic circuit 203, the detection circuit 205, and the controller 207 respectively explained in the detailed description of FIG. 2A.

The detection circuit 305 includes a current source circuit 305a and a comparator circuit 305b. The detection circuit 305 is connected to the reference winding 203b of FIG. 2B. To that end, the current source circuit 305a and the comparator circuit 305b are connected to the reference winding 203b. The controller 307 is connected to the current source circuit 305a and to the comparator 305b using one or more input and output pins of the controller 307.

The controller 307 is configured to control the current source circuit 305a to supply a reference current to the reference winding 203b of the magnetic circuit 303. For instance, the controller 307 controls the current source circuit 305a to supply a predefined ampere and a predefined frequency of the reference current to the reference winding 203b. In an example embodiment, the controller 307 controls the current source circuit 305a to bias the condition of the magnetic core 203a by providing the reference current to the reference winding 203b. For instance, the controller 307 controls the current source circuit 305a to supply the reference current such that a delta (difference) between the reference current and the current in the electrical line 109 is exceeding a saturation current of the magnetic core 203a. As used herein, the saturation current of the magnetic core 203a is a maximum current value beyond which the magnetic core 203a moves to the saturated condition. In other words, the current source circuit 305a supplies the reference current to the reference winding 203b to saturate the magnetic core 203a, based on control signals from the controller 307. To that end, the magnetic 203a moves to the saturated condition.

According to some embodiments, the magnetic core 203a changes from the saturated condition to the desaturated condition, when the reference current is equal to the current in the electrical line 109. The magnetic core 203a may produce a magnetic flux when the reference current is equal to the current in the electrical line 109. The magnetic flux enables magnetic coupling thereby ensuring the magnetic core changes from saturation condition to desaturation condition. Further, the reference current tracks or synchronizes with the current in the electrical line 109, while the magnetic core 203a is in the desaturated condition. To that end, the controller 307 is further configured to control the current source circuit 305a to change the condition of the magnetic core from the saturated condition to the desaturated condition by adjusting the reference current. For instance, the controller 307 controls the current source circuit 205a to adjust the reference current for changing the condition of the magnetic core from the saturated condition to the desaturated condition.

The magnetic core 203a remains in the desaturated condition for a short duration of time. For instance, the magnetic core 203a remains in the desaturated condition until the reference current is equal to the current in the electrical line 109. Due to sinusoidal property of the current in the electrical line 109, the magnetic core 203a changes from the desaturated condition to the saturated condition. For instance, the magnetic core 203a changes from the desaturated condition to the saturated condition, when the reference current is not equal to the current in the electrical line 109. In other words, the magnetic core 203a changes from the desaturated condition to the saturated condition, when the current in the electrical line 109 exceeds the reference current.

Due to magnetic coupling, a voltage pulse appears across the reference winding 203b when the magnetic core 203a changes from the saturated condition to the desaturated condition. Due to magnetic decoupling, the voltage pulse disappears across the reference winding 203b when the magnetic core 203a changes from the desaturated condition to saturated condition. To that end, the comparator circuit 305b is configured to detect the voltage pulse across the reference winding 203b, when the magnetic core 203a changes from the saturated condition to the desaturated condition.

The coupling and decoupling of the magnetic core 203a occur twice per AC cycle for the supplied reference current. Therefore, in an embodiment, the comparator circuit 305b comprises two comparators. For instance, one comparator of the comparator circuit 305b detects a voltage rising edge and another comparator of the comparator circuit 305b detects a voltage falling edge.

Further, the comparator circuit 305b is configured to generate the detection signal based on the detected voltage pulse. In an embodiment, the comparator circuit 305b generates the detection signal when the detected voltage pulse is greater than a threshold value. For instance, the comparator circuit 305b generates the detection signal by comparing the detected voltage pulse across the reference winding 203b and the threshold value. To that end, the comparator circuit 305b avoids voltage pulses that are detected across the reference winding 203b due to noise. In an alternate embodiment, the comparator circuit 305b outputs the voltage pulse detected across the reference winding 203b as the detection signal.

The controller 307 is connected to the comparator circuit 305 to receive the detection signal from the comparator circuit 305b. Further, the controller 307 is configured to measure the current in the electrical line 109 in response to the detection signal from the comparator circuit 305b. In an embodiment, the controller 307 samples the reference current and records a timestamp of a sampled value of the reference current for measuring the current in the electrical line 109. For instance, the controller 307 samples the reference current and records the timestamp when the comparator circuit 305b is triggered due to magnetic coupling. The reference current sampled by the controller 307 is proportional to the current in the electrical line 109 as the voltage pulse appears across the reference winding 203b only when the reference current is equal to the current in the electrical line 109 (i.e. when the magnetic core 203a changes from the saturated condition to desaturated condition). In an example embodiment, the controller 307 uses an Analog to Digital Converter (ADC) to sample the reference current. In an example embodiment, the controller 307 uses a Timer Counter (for instance, a 32 bit timer counter) to record the timestamp of the samples.

In this way, the controller 307 acquires a plurality of sampled values of the reference current for one-half cycle of the reference current and/or two-half cycles of the reference current, when the reference current is equal to the current in the electrical line 109. In other words, every time the comparator circuit 305b is triggered, the controller 307 samples the reference current and records the timestamp for one-half cycle of the reference current and/or two-half cycles of the reference current to acquire the plurality of sample values of the reference current. The controller 307 further processes the plurality of sampled values to calculate an average value of the reference current. In an embodiment, the controller 307 determines a phase time for each of the plurality of sampled values of the reference current and sorts the plurality of sampled values of the reference current based on the determined phase time for calculating the average value of the reference current. In an example embodiment, the controller 307 uses a SC-timer (State Configurable Timer) to handle the sampled values of the reference current. The calculated average value of the reference current is proportional to an average current (such as an RMS second current) in the electrical line 109. The controller 307 further multiplies the calculated average value of the reference current with the predefined number of turns of the reference winding 203b for calculating the average current (such as the RMS second current) in the electrical line 109.

In this way, the current sensing circuit 301 accurately calculates the current (for instance, the RMS current) in the electrical line 109 by controlling the reference current to saturate and desaturate the magnetic core 203a. The current sensing circuit 301 is cost efficient than currently available current sensing technologies, as the current sensing circuit 301 uses the magnetic core 203a that has small dimensions and the magnetic core 203a that is made of soft saturating materials. Further, the current sensing circuit 301 is simpler to construct, as the current sensing circuit 301 uses the magnetic circuit 303 that has less number of turns of the reference winding 203b.

The current sensing circuit 301 has a wider range of temperature stability. In other words, the current sensing circuit 301 is least affected by the temperature changes. For instance, the current sensing circuit 301 accurately measures the current in a temperature range of about −40 degrees Celsius to about +120 degrees Celsius. The current sensing circuit 301 has a better EMC (Electro-Magnetic Compatibility) performance than the currently available current sensing technologies, as the current sensing circuit 301 is not affected by any external field. For instance, the current sensing circuit 301 is not affected by any external field, because the magnetic core 203a spends most of its time in the saturated condition. Further, an example circuit diagram of the current sensing circuit 301 for measuring the current in the electrical line 109 is as shown in FIG. 4.

Figure 4:
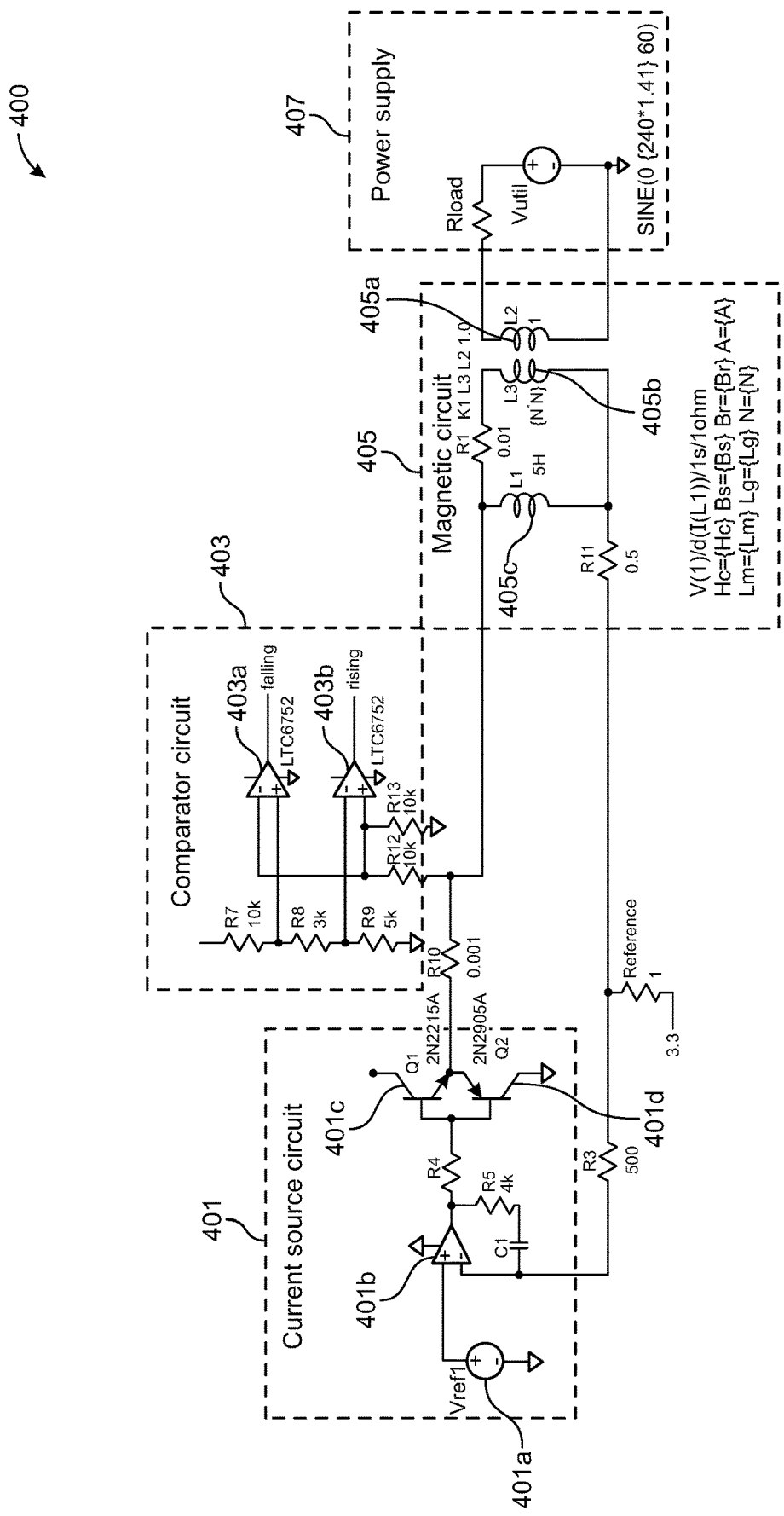
FIG. 4 depicts a circuit diagram of the current sensing circuit for measuring the current in the electrical line, in accordance with an example embodiment of the present invention.

FIG. 4 depicts a circuit diagram 400 of the current sensing circuit 301 for measuring the current in the electrical line 109, in accordance with an example embodiment of the present invention. The circuit diagram 400 includes a current source circuit 401, a comparator circuit 403, a magnetic circuit 405, and a power supply 407. The current source circuit 401, the comparator circuit 403, and the magnetic circuit 405 correspond to the current source circuit 305a, the comparator circuit 305b, and the magnetic circuit 303 respectively explained in the detailed description of FIG. 3. The current source circuit 401 is connected to the comparator circuit 403 as depicted in FIG. 4. Further, the current source circuit 401 and the comparator circuit 403 are connected to the magnetic circuit 405 as depicted in FIG. 4.

The magnetic circuit 405 comprises a primary winding 405a, and a secondary winding 405b. The primary winding 405a may correspond to windings of the conductor 203c. The secondary winding 405b may correspond to windings of the reference winding 203b. For instance, the secondary winding 403b is about two hundred and fifty turns. The magnetic circuit 405 additionally comprises an inductor 405c in parallel to a transformer comprising the primary winding 405a and the secondary winding 405b. The inductor 405c is connected in parallel to the transformer to simulate the magnetic coupling.

The current source circuit 401 is connected to the secondary winding 405b and configured to supply the reference current to the secondary winding 405b based on the control signals received from the controller 307 (not shown in this figure). In an example embodiment, the current source circuit 401 comprises a reference source 401a, an op-amp (operational-amplifier) 401b, an n-p-n transistor 401c and a p-n-p transistor 401d, which are arranged and connected as depicted in FIG. 4 for supplying the reference current to the secondary winding 405b.

The comparator circuit 403 is connected to the secondary winding 405b and configured to detect the voltage pulse across the secondary winding 405b, in response to detecting the change in the condition of the magnetic core 203a (not shown in this figure). In an example embodiment, the comparator circuit 403 comprises a first comparator 403a and a second comparator 403b, which are arranged and connected as depicted in FIG. 4 for detecting the voltage pulse. The first comparator 403a is configured to detect the voltage falling edge. The second comparator 403b is configured to detect the voltage rising edge.

The power supply 407 corresponds to the power supply 101. The power supply 407 comprises a voltage source and a resistor. Further, output waveforms of the circuit diagram 400 are as shown in FIG. 5A-5B.

Figure 5A:
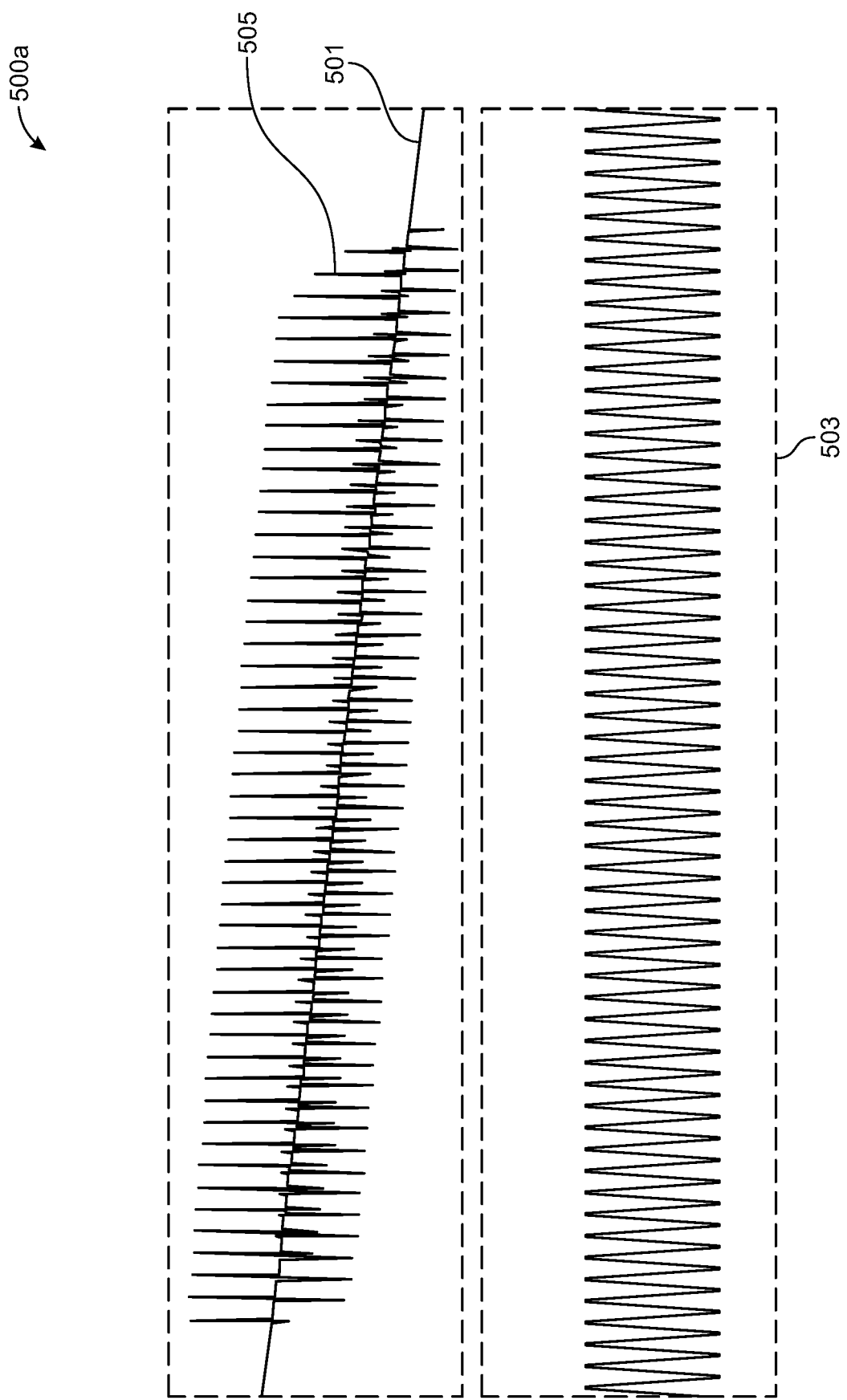
FIG. 5A depicts a snapshot showing output waveforms of the circuit diagram, in accordance with an example embodiment of the present invention.

FIG. 5A depicts a snapshot 500a showing output waveforms of the circuit diagram 400, in accordance with an example embodiment of the present invention. The snapshot 500a illustrates a reference current 501 in the reference winding 203b and a current 503 in the electrical line 109 (i.e. a current 503 in the conductor 203c). As shown in the snapshot 500a, when the reference current 501 is equal to the current 503 in the electrical line 109, a spike 505 in the reference current 501 appears to notify that the magnetic core 203a has changed from the saturated condition to the desaturated condition.

Figure 5B:
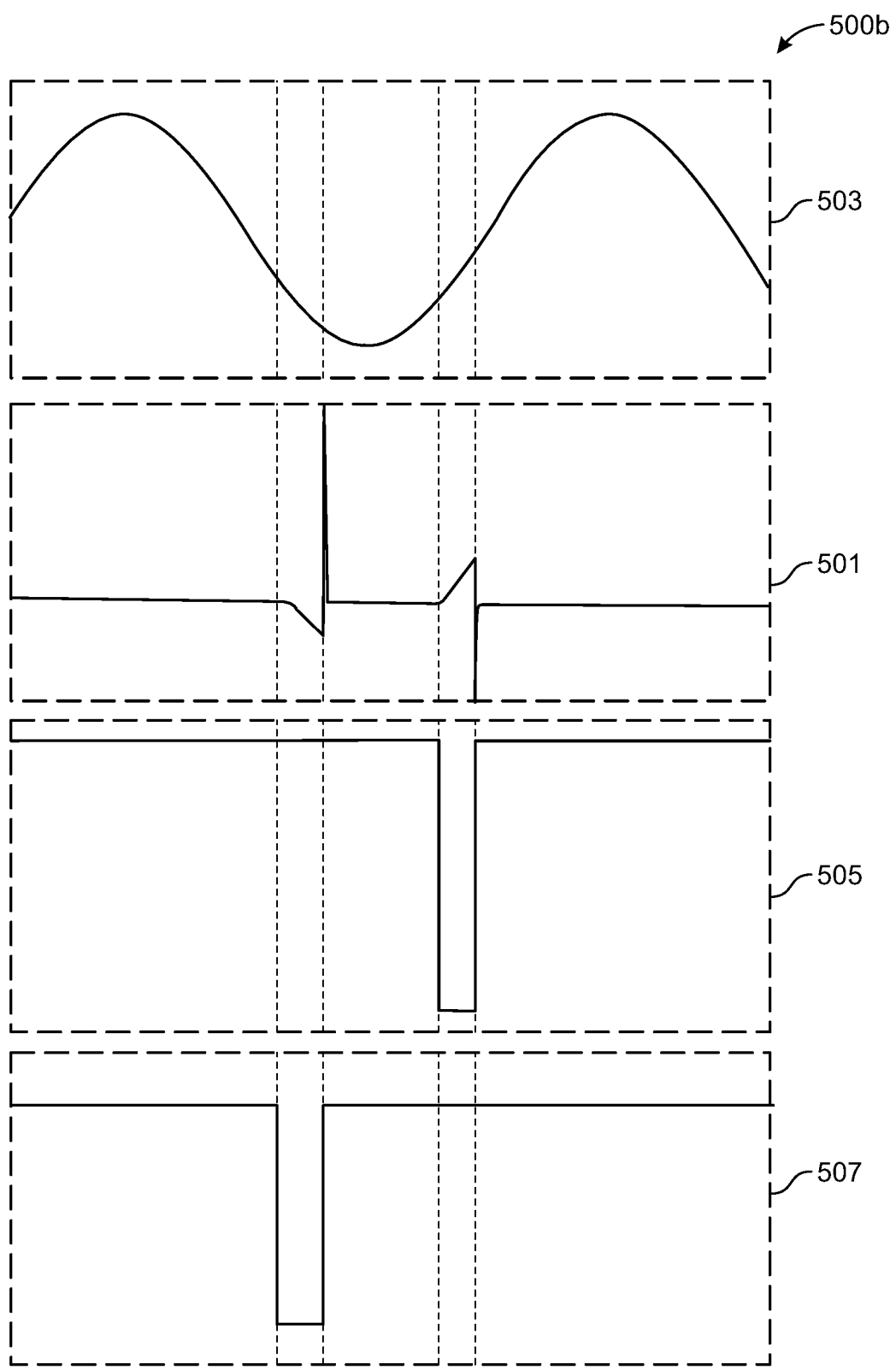
FIG. 5B depicts a snapshot showing output waveforms of the circuit diagram for two-half cycles of the current in the electrical line, in accordance with an example embodiment of the present invention.

FIG. 5B depicts a snapshot 500b showing output waveforms of the circuit diagram 400 for one AC cycle of the current in the electrical line 109, in accordance with an example embodiment of the present invention. The snapshot 500b shows a closer view corresponding to one AC cycle of the output waveform of FIG. 5A. The snapshot 500b illustrates the reference current 501, the current 503 in the electrical line 109, a voltage rising edge 505 outputted by the comparator 403b, and a voltage falling edge 507 outputted by the comparator 403a. As shown in the snapshot 500b, the voltage rising edge 505 and the voltage falling edge 507 are outputted by the first comparator 403b and the second comparator 403a respectively, when the reference current 501 is equal to the current 503 in the electrical line 109. Further, the snapshot 500b illustrates that the reference current 501 synchronizes with the current 503 for a short duration, when the reference current 501 is equal to the current 503 (i.e. when the magnetic core 203a is in the desaturated condition).

Figure 6:
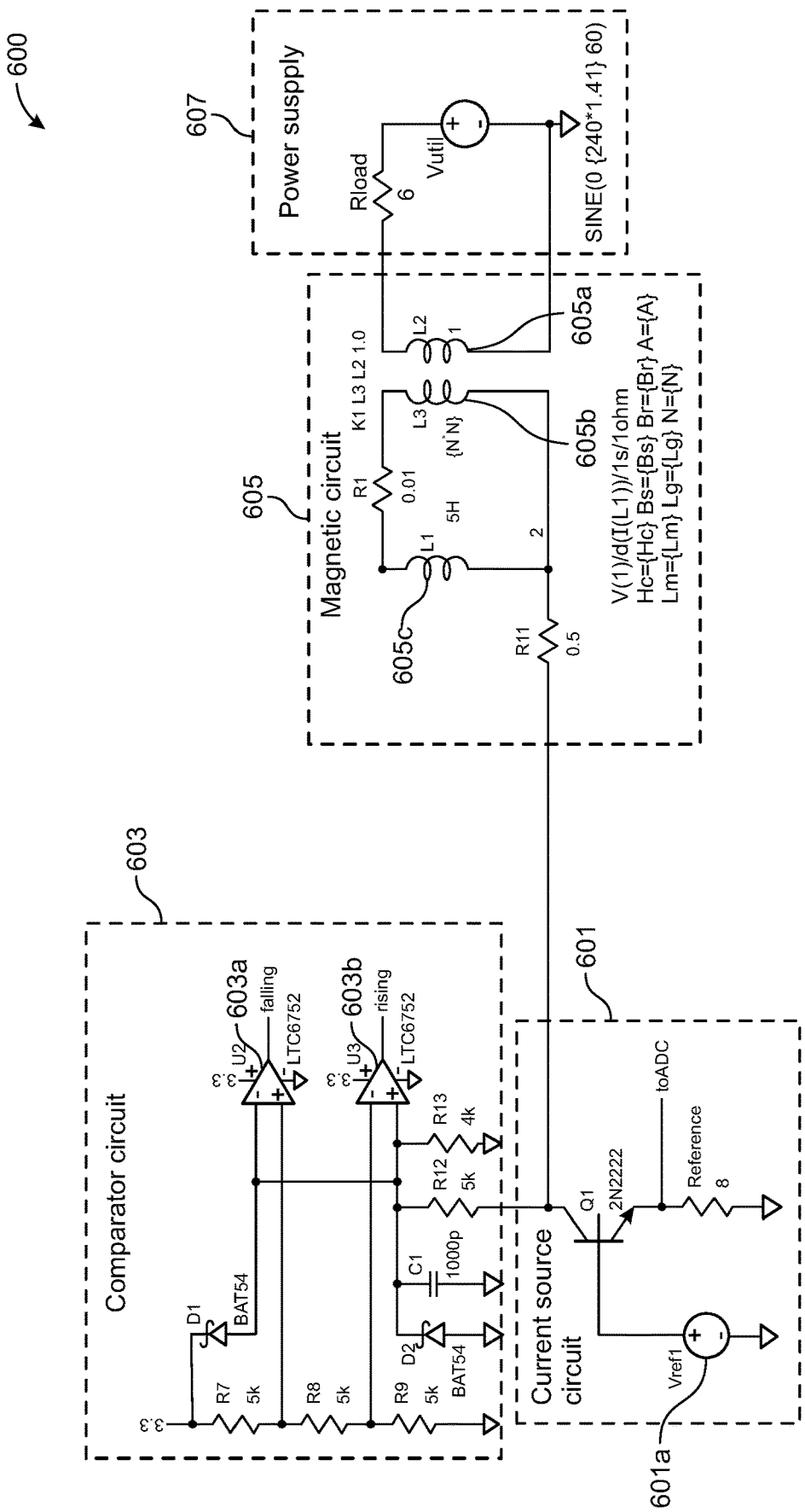
FIG. 6 depicts a circuit diagram of the current sensing circuit for measuring the current in the electrical line, in accordance with an example embodiment of the present invention.

FIG. 6 depicts a circuit diagram 600 of the current sensing circuit 301 for measuring the current in the electrical line 109, in accordance with an example embodiment of the present invention. The circuit diagram 600 includes a current source circuit 601, a comparator circuit 603, a magnetic circuit 605, and a power supply 607. The current source circuit 601, the comparator circuit 603, and the magnetic circuit 605 correspond to the current source circuit 305a, the comparator circuit 305b, and the magnetic circuit 303 respectively explained in the detailed description of FIG. 3. The current source circuit 601 is connected to the comparator circuit 603 as depicted in FIG. 6. Further, the current source circuit 601 and the comparator circuit 603 are connected to the magnetic circuit 605 as depicted in FIG. 6.

The magnetic circuit 605 comprises a primary winding 605a, and a secondary winding 605b. The primary winding 605a may correspond to windings of the conductor 203c. The secondary winding 605b may correspond to windings of the reference winding 203b. In some embodiments, the magnetic circuit 605 additionally comprises an inductor 605c in parallel to a transformer comprising the primary winding 605a and the secondary winding 605b. The inductor 605c is connected in parallel to the transformer to simulate the magnetic coupling.

The current source circuit 601 is connected to the secondary winding 605b and configured to supply the reference current to the secondary winding 605b based on the control signals received from the controller 307. In an example embodiment, the current source circuit 601 comprises a reference source 601a and a single n-p-n transistor 601b, which are arranged and connected as depicted in FIG. 6 for supplying the reference current to the secondary winding 605b.

The comparator circuit 603 is connected to the secondary winding 605b and configured to detect the voltage pulse across the secondary winding 605b, in response to detecting the change in the condition of the magnetic core 203a. In an example embodiment, the comparator circuit 603 comprises a first comparator 603a and a second comparator 603b, which are arranged and connected as depicted in FIG. 6 for detecting the voltage pulse. The first comparator 603a is configured to detect the voltage falling edge. The second comparator 603b is configured to detect the voltage rising edge. The power supply 607 corresponds to the power supply 101. The power supply 607 comprises a voltage source and a resistor.

The circuit diagram 600 of the current sensing circuit 301 is a simplified version of the circuit diagram 400 of the current sensing circuit 301 as the current source circuit 601 includes one n-p-n transistor 601b. Further, the requirement of an op-amp in the current source circuit 601 is eliminated thereby reducing circuit complexity and cost. To that end, the circuit diagram 600 of the current sensing circuit 301 detects the voltage pulse in one-half cycle of the AC supply as the current in the electrical line 109 is symmetrical and sinusoidal. Further, output waveforms of the circuit diagram 600 are as shown in FIG. 7.

Figure 7:
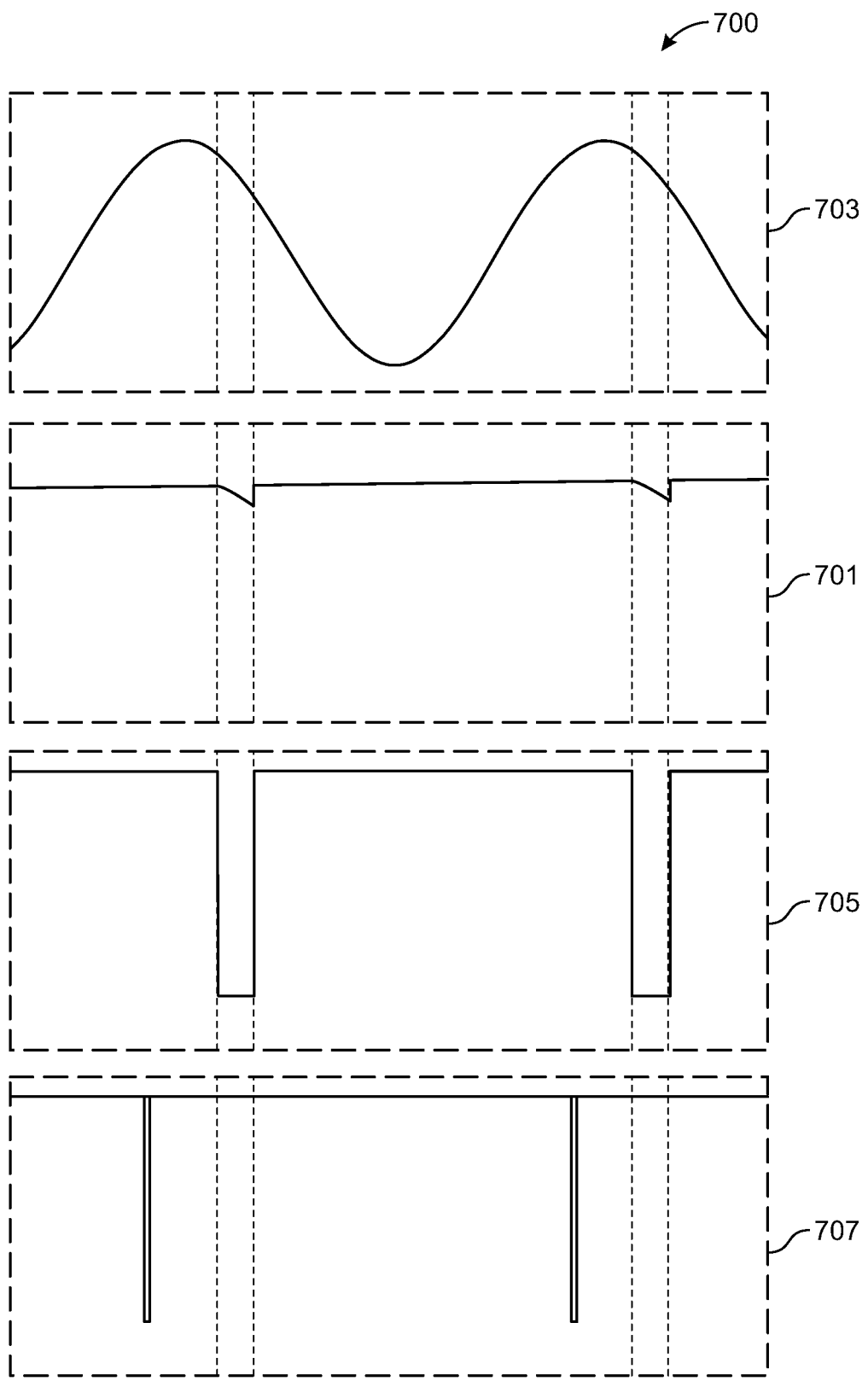
FIG. 7 depicts a snapshot showing output waveforms of the circuit diagram, in accordance with an example embodiment of the present invention.

FIG. 7 depicts a snapshot 700 showing output waveforms of the circuit diagram 600, in accordance with an example embodiment of the present invention. The snapshot 700 illustrates a reference current 701 in the reference winding 203b, a current 703 in the conductor 203c, a voltage rising edge 705 outputted by the second comparator 603b, and a voltage falling edge 707 outputted by the first comparator 603a. As shown in the snapshot 700, the voltage rising edge 705 is outputted by the second comparator 603b, when the reference current 701 is equal to the current 703. The voltage falling edge 707 is outputted as a flat pulse (for instance, a pulse with no duration) by the first comparator 603a due to the simplification of the current source circuit 601. However, modifying the secondary winding 605b i.e., reference winding in the circuit diagram 600 to a push-pull configuration allows detecting the voltage pulse in both positive and negative half cycles of the current in the electrical line 109. Further, the push-pull configuration of the current source circuit 601 is as shown in FIG. 8.

Figure 8:
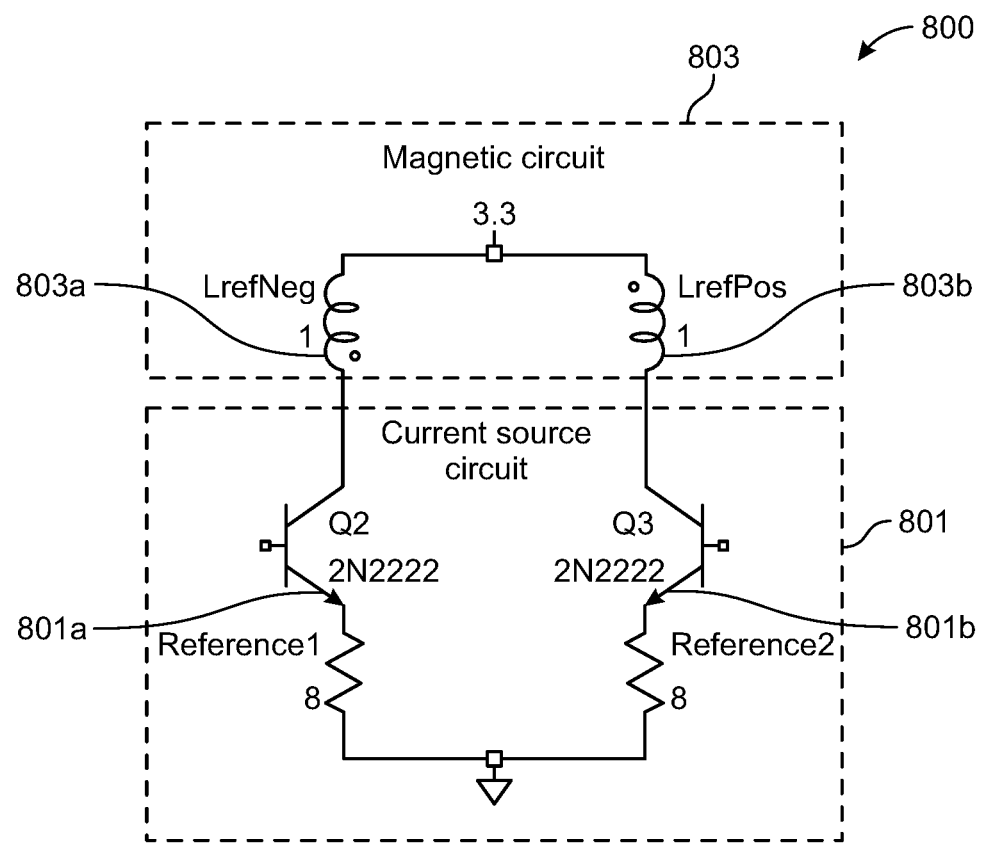
FIG. 8 depicts a circuit diagram showing a push-pull configuration of a current source circuit, in accordance with an example embodiment of the present invention.

FIG. 8 depicts a circuit diagram 800 showing the push-pull configuration of the current source circuit 601, in accordance with an example embodiment of the present invention. The circuit diagram 800 includes a current source circuit 801 and a magnetic circuit 803. The current source circuit 801 corresponds to the push-pull configuration of the current source circuit 601. The magnetic circuit 803 corresponds to the push-pull configuration of the magnetic circuit 603. The current source circuit 801 comprises two n-p-n transistors 801a and 801b for driving the magnetic circuit 803 in both the half cycles. The magnetic circuit 803 comprises two secondary windings 803a and 803b. The secondary winding 803a corresponds to one-half of the reference winding 203b and the secondary winding 803b corresponds to another-half of the reference winding 203b. The secondary winding 803a is wound in opposite direction to the secondary winding 803b or the secondary winding 803b is wound in opposite direction to the secondary winding 803a for detecting the voltage pulse in both the half cycles of the current. Therefore, modifying the current source circuit 601 and the magnetic circuit 605 to the current source circuit 801 and the magnetic circuit 803 respectively allows detecting of the voltage pulse in both the half cycles of the current in the electrical line 109.

Figure 9:
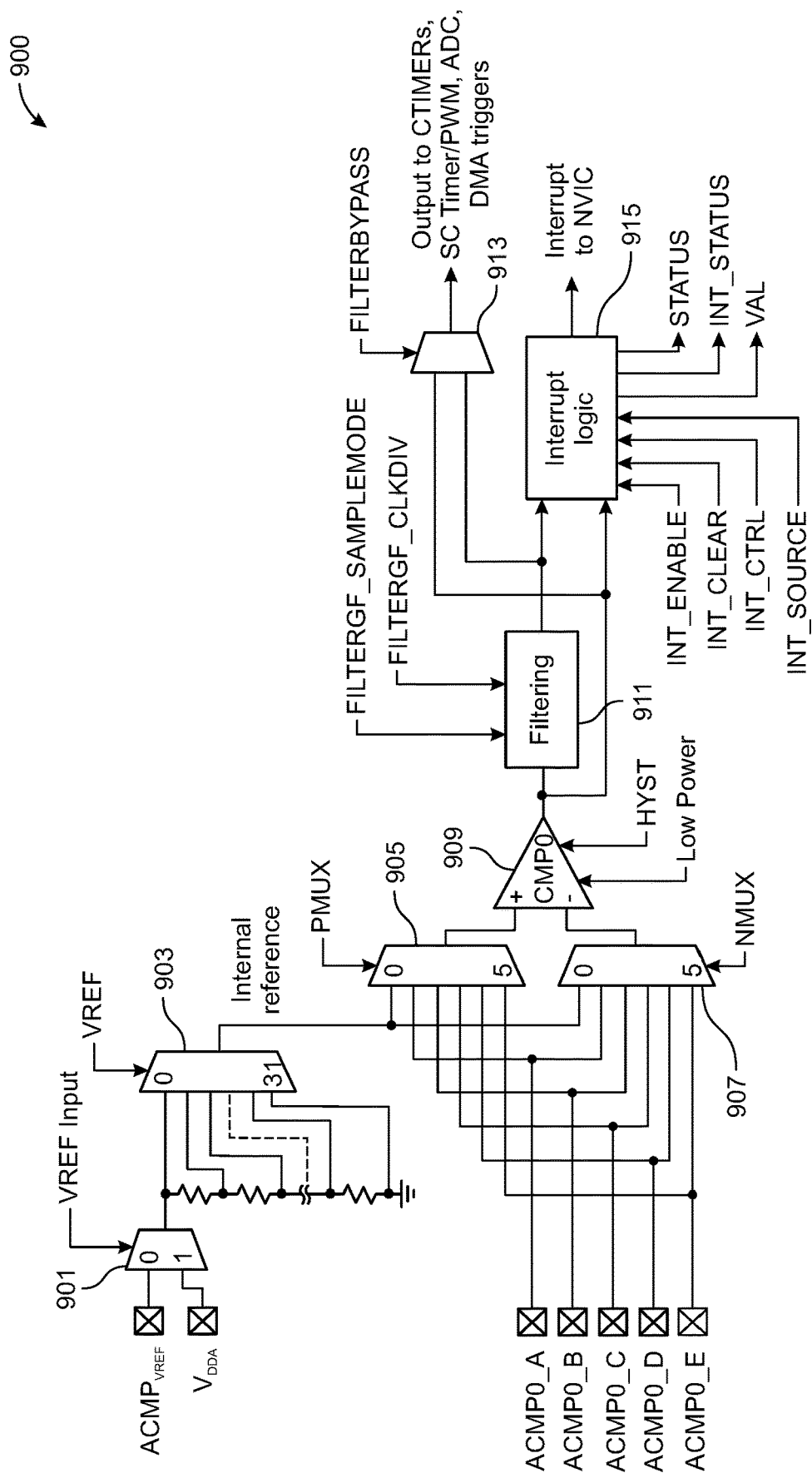
FIG. 9 depicts a comparator configuration in a controller for detecting a voltage pulse, in accordance with an example embodiment of the present invention.

FIG. 9 depicts a comparator configuration 900 in the controller 307 for detecting the voltage pulse, in accordance with an example embodiment of the present invention. In some example embodiments, the comparator circuit 305b that is external to the controller 307 may be embodied within the controller 307 as depicted in the comparator configuration 900. To that end, the circuit diagram 400 and/or the circuit 600 may be further simplified as the comparator circuit 403 and/or the comparator circuit 603 is embodied within the controller 307. The comparator configuration 900 includes a plurality of multiplexers 901, 903, 905, 907, and 913, a comparator 909, a filtering block 911 and an interrupt logic 915. The plurality of multiplexers 901, 903, 905, and 907 are connected to the comparator 909 as depicted in FIG. 9. The plurality of multiplexers 901, 903, 905, and 907 are configured to set the comparator 909 to at least one of a rising configuration and a falling configuration. In an example embodiment, the multiplexer 905 is supplied with a voltage reference value from an input pin number twenty-one of the multiplexer 903 and the multiplexer 907 is supplied with input pins for setting the comparator 909 to the rising configuration. In an example embodiment, the multiplexer 905 is supplied with the input pins and the multiplexer 907 is supplied with a voltage reference value from an input pin number ten of the multiplexer 903 for setting the comparator 909 to the falling configuration.

In an embodiment, the comparator 909 is configured to detect the voltage rising edge when the comparator 909 is set to the rising configuration. In an alternate embodiment, the comparator is configured to detect the voltage falling edge when the comparator 909 is set to the rising configuration. The detected voltage pulse is outputted to the SC-timer, the ADC, and/or the Timer counter for measuring the current in the electrical line 109. In some embodiments, the output from the comparator 909 is filtered by the filtering block 911. The filtering block 911 filters unwanted frequencies thereby ensuring that the measuring of the current in the electrical line 109 is not triggered due to noise. Therefore, the filtering bock 911 reduces false triggering arising due to transient voltage spikes triggered by noise and ensures that genuine voltage pulse is measured. The output from the filtering block 911 is provided to the interrupt logic block 915 and to the multiplexer 913. The interrupt logic block 915 provides an interrupt or delay signal to a nested vector interrupt control (NVIC) logic to ensure that the sampling of reference current is interrupted when the reference current is not equal to the current in the electrical line 109. The multiplexer 913 is a filter bypass multiplexer that ensures that the output signal from the filtering block 911 does not pass through the interrupt logic 915. The filer bypass multiplexer 913 reduces the time required for processing the voltage pulse from the comparator 909. Further, a method executed by the controller 307 for measuring the current in the electrical line 109 is as explained in the detailed description of FIG. 10A-10B.

Figure 10A:
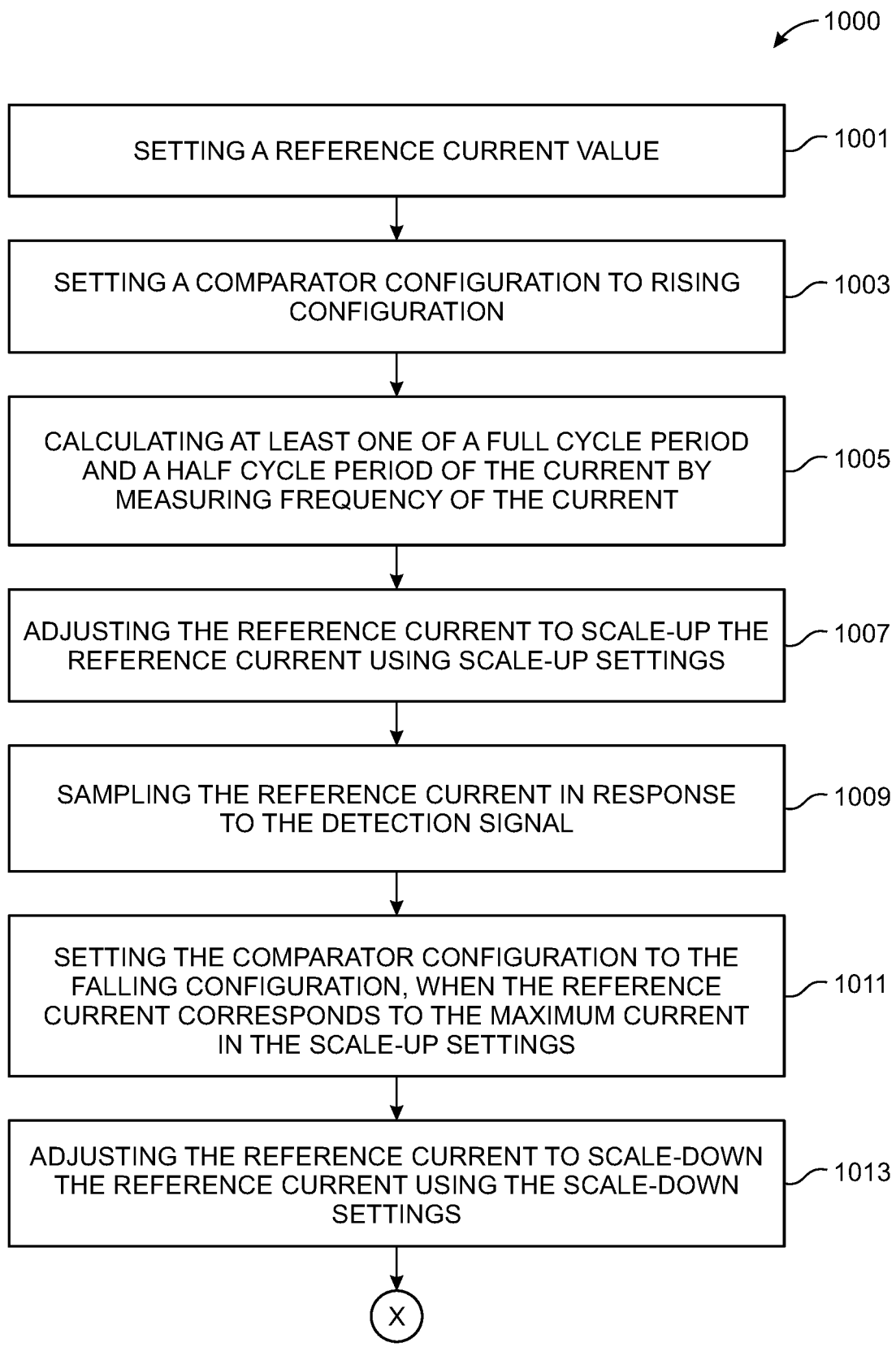
FIG. 10A-10B depicts a method executed by the controller for measuring the current in the electrical line, in accordance with an example embodiment of the present invention.
Figure 10B:
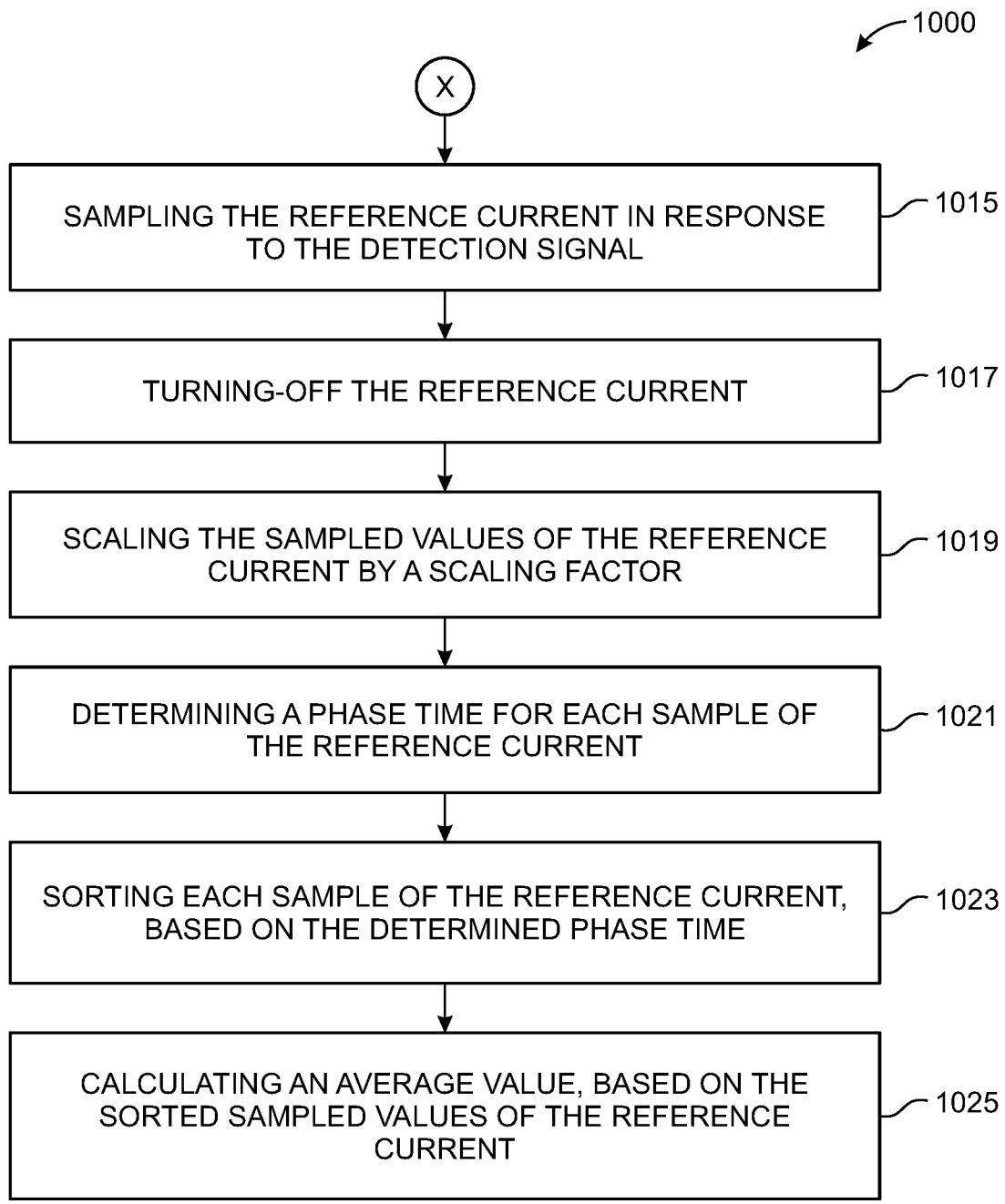

FIG. 10A-10B depicts a method 1000 executed by the controller 307 for measuring the current in the electrical line 109, in accordance with an example embodiment of the present invention. The method 1000 may be used in conjunction with the current sensing circuit 301 described in the detailed description of FIG. 3. Although various steps of method 1000 is described in the detailed description of FIG. 10A-10B, the steps need not necessarily all be performed, and in some cases may be performed in a different order than the order shown.

Starting at step 1001, the method 1000 includes setting the reference current value. For instance, the controller 307 sets the reference current value to control the current source circuit 305a for supplying the reference current to the magnetic circuit 303. In an embodiment, the controller 307 sets the reference current value to zero. In an alternate embodiment, the controller 307 sets the reference current value to a predefined ampere to bias the condition of the magnetic core 203a. The condition of the magnetic core 203a may be at least one of the saturated condition and the desaturated condition based on the reference current and the current in the electrical line 109. The reference current may be the PWM signal.

At step 1003, the method 1000 includes setting a comparator configuration to the rising configuration for detecting the voltage pulse (i.e. the voltage rising edge) across the reference winding 203b. For instance, the controller 307 sets the comparator configuration to the rising configuration as explained in the detailed description of FIG. 9. In some cases, the controller 307 may bypass the step 1003, when the current sensing circuit 301 uses the comparator circuit 305b that is external to the controller 307.

At step 1005, the method 1000 includes calculating at least one of a full cycle period and a half-cycle period of the current in the electrical line 109 by measuring a frequency of the current in the electrical. For instance, the controller 307 measures the frequency of the current in the electrical line 109 and calculates at least one of the full cycle period and the half-cycle period of the current in the electrical line 109, based on the measured frequency.

At step 1007, the method 1000 includes adjusting the reference current to scale-up the reference current using scale-up settings. For instance, the controller 307 controls the current source circuit 305a to adjust the reference current for scaling-up the reference current using the scale-up settings. In one embodiment, the controller 307 adjusts the reference current to scale-up the reference current in a linear manner. To that end, the reference current may be scaled-up as a ramp signal. In another embodiment, the controller 307 adjusts the reference current to scale-up the reference current in a sinusoidal manner. To that end, the reference current may be scaled-up as a sinusoidal signal. In yet another embodiment, the controller 307 adjusts the reference current to scale-up in a random manner. To that end, the reference current may be scaled-up as a random signal. The scale-up settings comprise a predefined ampere of the reference current to be scaled-up after a short duration of time. The duration of time may range from 10 milliseconds to 100 milliseconds. In some embodiment, after every 10 milliseconds or 100 milliseconds, the predefined ampere of the reference current is increased. In other words, the scale-up settings comprise a max duty of the reference current and a percentage of the max duty (i.e. a scale rate) to be scaled-up for every 10 milliseconds to 100 milliseconds range. For instance, if the max duty of the reference current is forty amperes, the controller 307 scales-up the reference current to forty amperes at the scale rate of twenty percent of max duty for every ten milliseconds, by adjusting the reference current.

At step 1009, the method 1000 includes sampling the reference current in response to the detection signal from the detection circuit 305. For instance, the controller 307 samples the reference current and stores a sampled value along with the timestamp in an array, in response to the detection signal from the detection circuit 305. The method 1000 may further include, at step 1009, providing a delay after obtaining the sampled value and before receiving another detection signal from the detection circuit 305. For instance, the controller 307 may provide a delay of one millisecond after obtaining the sampled value and before receiving another detection signal from the detection circuit 305.

At step 1011, the method 1000 includes setting the comparator configuration to the falling configuration, when the reference current corresponds to the maximum current in the scale-up settings. For instance, when the reference current corresponds to the maximum current in the scale-up settings, the controller 307 sets the comparator configuration to the falling configuration as explained in the detailed description of FIG. 9. In some cases, the controller 307 may bypass the step 1011, when the current sensing circuit 301 uses the comparator circuit 305b that is external to the controller 307.

At step 1013, the method 1000 includes adjusting the reference current to scale-down the reference current using the scale-down settings. For instance, the controller 307 controls the current source circuit 305a to adjust the reference current for scaling-down the reference current using the scale-down settings. In one embodiment, the controller 307 adjusts the reference current to scale-down the reference current in a linear manner. In another embodiment, the controller 307 adjusts the reference current to scale-down the reference current in a sinusoidal manner. In yet another embodiment, the controller 307 adjusts the reference current to scale-down in a random manner. The scale-down settings comprise a predefined ampere of the reference current to be scaled-down after a short duration of time. The duration of time may range from 10 millisecond to 100 milisecond. In some embodiment, after every 10 milliseconds or 100 milliseconds, the predefined ampere of the reference current is decreased. In other words, the scale-down settings comprise the max duty of the reference current and a percentage of the max duty (i.e. a scale rate) to be scaled-down for every 10 milliseconds to 100 milliseconds range. For instance, if the max duty of the reference current is forty amperes, the controller 307 scales-down the reference current to zero amperes at the scale rate of twenty percent of the max duty for every 10 milliseconds, by adjusting the reference current.

At step 1015, the method 1000 includes sampling the reference current in response to the detection signal from the detection circuit 305. For instance, the controller 307 samples the reference current and stores the sampled value along with the timestamp in an array, in response to the detection signal from the detection circuit 305. The method 1000 may further include, at step 1015, providing a delay after obtaining the sampled value and before receiving another detection signal from the detection circuit 305. For instance, the controller 307 may provide a delay of one millisecond after obtaining the sampled value and before receiving another detection signal from the detection circuit 305.

At step 1017, the method 1000 includes turning-off the reference current. For instance, the controller 307 controls the current source circuit 305a to turn-off the reference current.

At step 1019, the method 1000 includes scaling the sampled values of the reference current by a scaling factor. For instance, the controller 307 scales, using the scaling factor, the sampled values stored in the array to ampere. For example, the scaling factor may be one ampere per 873.813 ADC count (1A/873.813 ADC count) for high power utility line, if the ADC is a 16-bit ADC.

At step 1021, the method 1000 includes determining a phase time for each sample of the reference current. For instance, the controller 307 determines the phase time for each sample of the reference current using a phase time formula: phase time=timestamp % period. The timestamp corresponds to the timestamp of the sampled value. The period corresponds to the period of the current in the electrical line 109.

At step 1023, the method 1000 includes sorting each sample of the reference current, based on the determined phase time. For instance, the controller 307 sorts each sample of the reference based on the phase time of each sample of the reference current.

At step 1025, the method 1000 includes calculating an average value of the reference current, based on the sorted sampled values of the reference current. For instance, the controller 307 calculates the average value of the reference current using a mathematical formula:

$$\text{Average current} = \sqrt{\text{IntegratedSquare}},$$

where the IntegratedSquare is mathematically represented as: IntegratedSquare=IntegratedSquare+(phase time[n]−phasetime [n−1])*(sample value[n]$^2$*samplevalue[n−1]$^2$*0.5)

The calculated average value of the reference current is proportional to an average value of the current in the electrical line 109. To that end, in some embodiments, the controller 307 multiplies the calculated average value with the predefined number of turns of the reference winding 203b for calculating the current in the electrical line 109.

On implementing the method 1000 provided herein, the controller 307 is configured to measure the current in the electrical line 109, when the current sensing circuit 301 comprising the controller 307 is arranged and connected as shown in FIG. 3.

Figure 11:
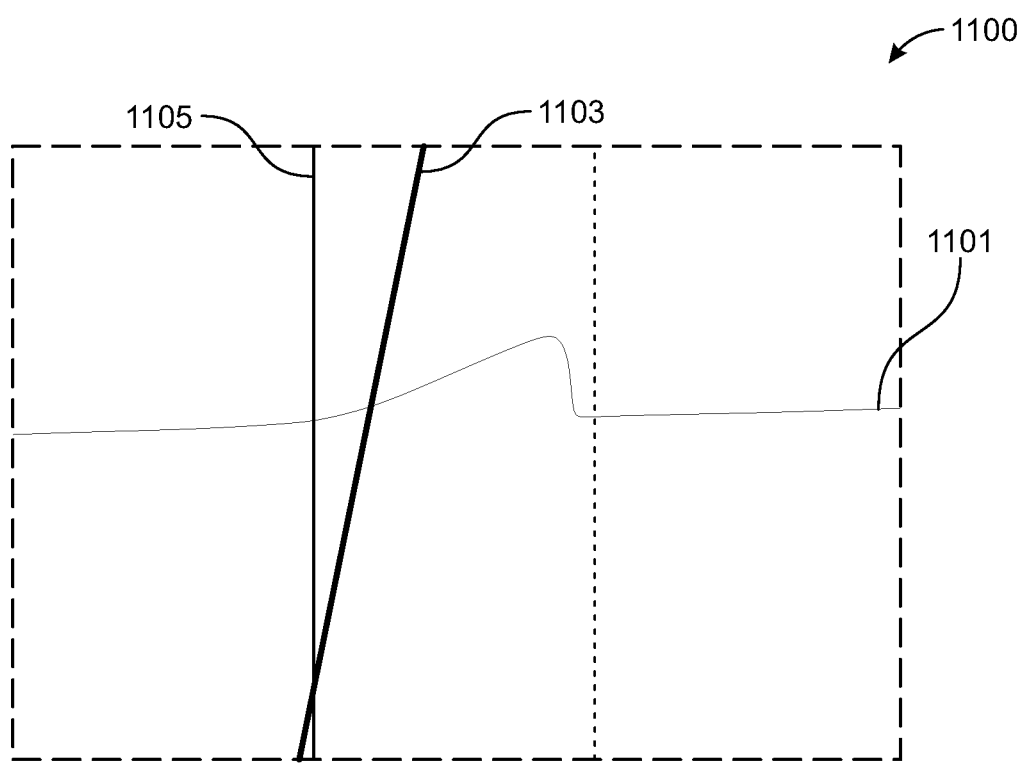
FIG. 11 depicts a snapshot showing an output waveform of a comparator circuit, in accordance with an example embodiment of the present invention.

FIG. 11 depicts a snapshot 1100 showing an output waveform of the comparator circuit 305b, in accordance with an example embodiment of the present invention. The snapshot 1100 illustrates a reference current 1101 in the reference winding 203b, a current 1103 in the electrical line 109 and a voltage falling edge 1107 outputted by the comparator 403a. As shown in the snapshot 1100, in some cases, the comparator 403a may be triggered a bit earlier before the reference current 1101 becomes equal to the current 1103. To that end, in some example embodiments, the controller 307 is configured to provide a delay after receiving the detection signal from the comparator circuit 305b or before sampling the reference current for sampling the reference current only when the reference current is equal to the current in the electrical line 109. Therefore, the current sensing circuit 301 samples the reference current only when the reference current is equal to the current in the electrical line 109 for accurately calculating the current in the electrical line 109.

Figure 12:
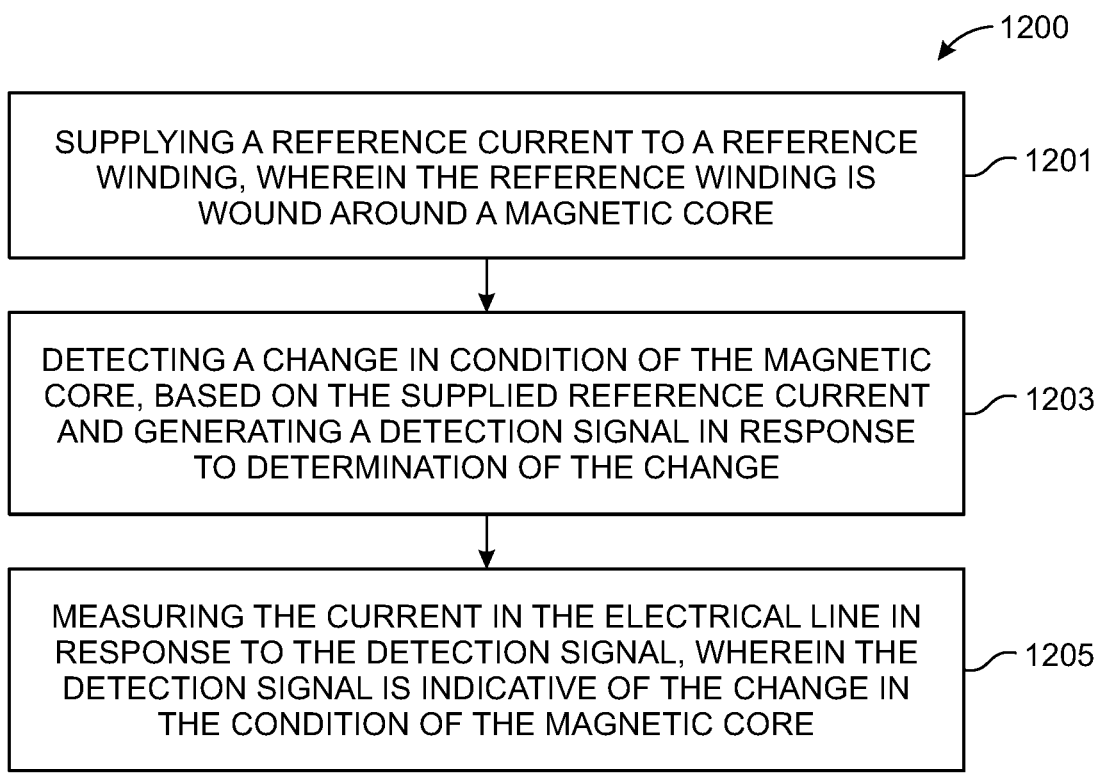
FIG. 12 depicts a method for measuring the current in the electrical line, in accordance with an example embodiment of the present invention.

FIG. 12 depicts a method 1200 for measuring the current in the electrical line 109, in accordance with an example embodiment of the present invention. The method 1200 may be used in conjunction with the current sensing circuit 301 described in the detailed description of FIG. 3. Starting, at step 1201, the method 1200 includes supplying the reference to the reference winding 203b of the magnetic circuit 203. For instance, the current source circuit 305a of the detection circuit 305 supplies the reference current to the reference winding 203b, based on the control signals received from the controller 307. In an example embodiment, the current source circuit 305 supplies the reference current such that the condition of the magnetic core 203a is changed to at least one of the saturated condition and the desaturated condition.

At step 1203, the method 1200 includes detecting the change in the condition of the magnetic core 203a, based on the supplied reference current and generating a detection signal in response to the determination of the change. For instance, the comparator circuit 305*b* of the detection circuit 305 detects the change in the condition of the magnetic core 203*a*. In an example embodiment, the comparator circuit 305*b* detects the voltage pulse across the reference winding 203*b* for detecting the change in the condition of the magnetic core 203*a*. According to some embodiments, the voltage pulse appears across the reference winding 203*b* when the reference current is equal to the current in the electrical line 109 (i.e. when the magnetic core 203*a* changes from the saturated condition to the desaturated condition). Further, the comparator circuit 305*b* generates the detection signal in response to detecting the change in the condition of the magnetic core 203*a*.

At step 1205, the method 1200 includes measuring the current in the electrical line 109, in response to the detection signal. For instance, the controller 307 measures the current in the electrical line 109, in response to the detection signal. Since, the detection signal is indicative of the change in the condition of the magnetic core 203*a* (i.e. the detection signal is indicating that the reference current is equal to the current in the electrical line), the controller 307 samples the reference current for measuring the current in the electrical line 109.

On implementing the method 1200 provided herein, the current sensing circuit 301 is configured to accurately measure the current in the electrical line 109, when the current sensing circuit 301 is arranged and connected as shown in FIG. 3.

Figure 13:
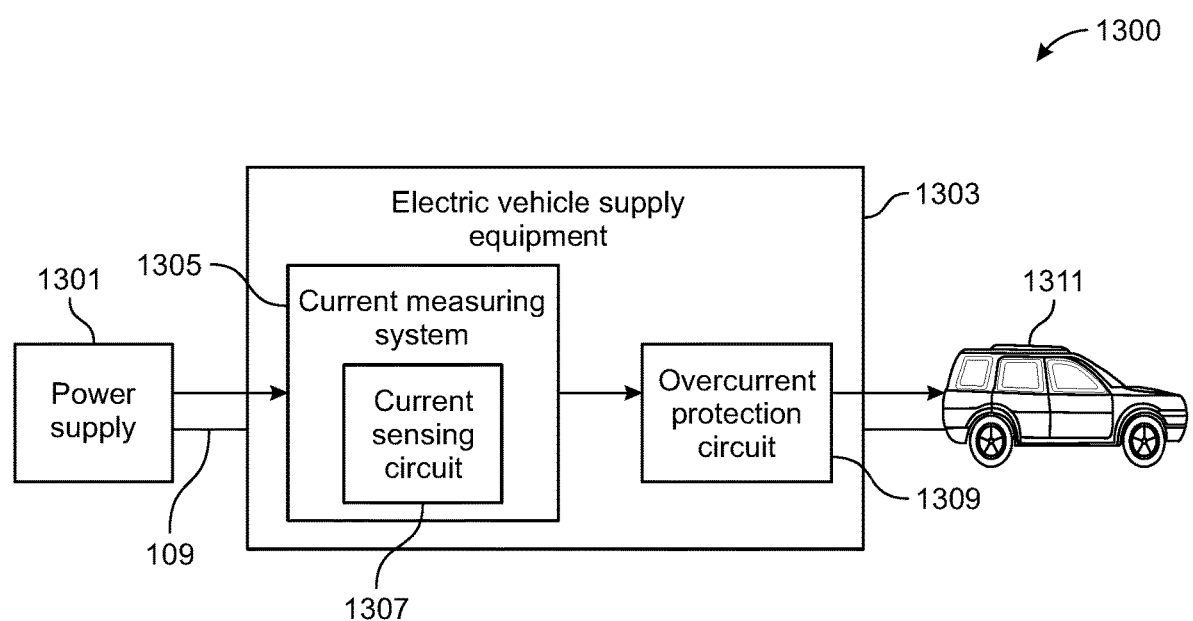
FIG. 13 depicts an exemplary working environment of the current measuring system, in accordance with an example embodiment of the present invention.

FIG. 13 depicts an exemplary working environment 1300 of the current measuring system 103, in accordance with an example embodiment of the present invention. The working environment 1300 includes a power supply 1301, an electric vehicle supply equipment (EVSE) 1303, and an electric vehicle 1311. The power supply 1301 corresponds to the power supply 101. The EVSE 1301 is an electric vehicle charging point or an electric vehicle charging system and corresponds to the load 107 depicted in FIG. 1. The EVSE 1301 supplies, from the power supply 1301, a requested electric power to the electric vehicle 1311 for charging the electric vehicle 1311. In an embodiment, the EVSE 1303 is connected between the power supply 1301 and the electric vehicle 1311 for supplying the requested electric power. The electric vehicle 1311 is a vehicle that uses one or more electric motors for propulsion.

The EVSE 1303 includes a current measuring system 1305 and an overcurrent protection circuit 1309. The current measuring system 1305 corresponds to the current measuring system 103. The current measuring system 1305 includes a current sensing circuit 1307. The current sensing circuit 1307 corresponds to the current sensing circuit 307. The current sensing circuit 1307 is connected to the electrical line 109 that connects the power supply 1301 to the electric vehicle 1311. The current sensing circuit 1307 measures the current in the electrical line 109 as explained in the detailed description of FIG. 3.

The overcurrent protection circuit 1309 is connected to the electrical line 109 and configured to prevent overcurrent conditions in the electrical line 109 in response to the measured current from the current sensing circuit 1307. The overcurrent conditions include conditions such as the current in the electrical conductor is above a configurable threshold supply value and the like. The configurable threshold supply value may be predetermined manually or automatically depending upon the requested electric power from the electric vehicle 1311. To that end, the overcurrent current protection circuit 1309 is configured to prevent excessive current from flowing to the electric vehicle 1311.

In an example embodiment, the overcurrent protection circuit 1309 is configured to determine whether the measured current from the current sensing circuit 1307 is above the configurable threshold supply value. Further, the overcurrent protection circuit 1309 is configured to interrupt the flow of the current in the electrical line 109 for preventing the overcurrent conditions, in response to determining the measured current is above the configurable threshold supply value. In an example embodiment, the overcurrent protection circuit 1309 interrupts the flow of the current in the electrical line 109 for a predetermined time period to prevent the overcurrent conditions. The flow of the current may be interrupted during a charge session of the electrical vehicle 1311.

In this way, the current measuring system 1305 comprising the current sensing circuit 1307 is used along with the overcurrent protection system 1309 in the EVSE 1303 for supplying the requested electric power and preventing the overcurrent conditions such that the electric vehicle 1311 is supplied with the requested electric power and further the electric vehicle 1311 is not damaged due to over-current conditions.

Additionally or alternatively, the current measuring system 1305 may be implemented in different applications. For example, the current measuring system 1305 may be used in ground fault detection systems, current regulators, and the like. The current measuring system 1305 may be used in the ground fault detection system to detect ground fault conditions such as the detection of stray electrical current flowing directly to the earth. The current measuring system 1305 may be used in the current regulators to monitor the current and regulate the current settings.

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention is herein disclosed by way of examples and should not be limited by the particular disclosed embodiments described above.

What is claimed is:

1. A current sensing circuit for measuring a current in an electrical line connecting an electrical supply to a load, the current sensing circuit comprising:
    a magnetic circuit having a magnetic core, a reference winding wound around the magnetic core, and a conductor passing through a center of the magnetic core, the conductor being connected to the electrical line;
    a detection circuit connected to the reference winding of the magnetic circuit, wherein the detection circuit is configured to detect a change in a condition of the magnetic core and generate a detection signal in response to a determination of the change, wherein the condition of the magnetic core is at least one of: a saturation condition and a desaturated condition, and wherein the detection circuit comprises:
        a current source circuit configured to supply a reference current to the reference winding to bias the condition of the magnetic core, wherein the condition of the magnetic core changes to at least one of: the saturation condition and the desaturated condition, based on the reference current and the current in the electrical line; and a comparator circuit configured to detect a voltage pulse across the reference winding and generate the detection signal in response to the detected voltage pulse, wherein the voltage pulse is generated when the condition of the magnetic core changes from the saturation condition to the desaturated condition; and a controller coupled to the detection circuit for receiving the detection signal, wherein the controller is configured to measure the current in the electrical line in response to receiving the detection signal from the detection circuit.

2. The current sensing circuit of claim 1, wherein the comparator circuit is further configured to generate the detection signal when the detected voltage pulse is greater than a threshold value.

3. The current sensing circuit of claim 1, wherein the controller is configured to control the current source circuit to adjust the reference current using at least one of: scale-up settings and scale-down settings.

4. The current sensing circuit of claim 1, wherein to measure the current in the electrical line, the controller is further configured to:
sample the reference current in response to the detection signal;
determine a phase time for each of the sampled values of the reference current;
sort the sampled values of the reference current, based on the determined phase time; and
calculate an average value for measuring the current in the electrical line, based on the sorted sampled values of the reference current, wherein the calculated average value is proportional to the current in the conductor connected to the electrical line.

5. The current sensing circuit of claim 1, wherein the magnetic core comprises:
a predefined inner diameter, and a predefined outer diameter; and
wherein the reference winding is wound for a predefined number of turns.

6. A method for measuring a current in an electric line connecting an electrical supply to a load, the method comprising:
supplying a reference current to a reference winding, wherein the reference winding is wound around a magnetic core;
detecting a change in a condition of the magnetic core, based on the supplied reference current and generating a detection signal in response to a determination of the change; and
measuring the current in the electrical line in response to the detection signal, wherein the detection signal is indicative of the change in the condition of the magnetic core, and wherein measuring the current in the electrical line in response to the detection signal further comprises:
sampling the reference current in response to the detection signal;
determining a phase time for each of sampled values of the reference current;
sorting the sampled values of the reference current, based on the determined phase time; and
calculating an average value for measuring the current in the electrical line, based on the sorted sampled values of the reference current, wherein the calculated average value is proportional to the current in the conductor connected to the electrical line.

7. The method of claim 6, wherein the condition of the magnetic core is at least one of: a saturation condition and a desaturated condition.

8. The method of claim 7, wherein detecting the change in the condition of the magnetic core further comprises detecting a voltage pulse across the reference winding, wherein the voltage pulse is generated when the condition of the magnetic core changes from the saturation condition to the desaturated condition.

9. The method of claim 6, wherein supplying the reference current to the reference winding further comprises adjusting the reference current using at least one of scale-up settings and scale-down settings.

10. An electric vehicle supply equipment (EVSE) comprising:
a current sensing circuit for measuring a current in an electrical line connecting an electrical supply to a load, the current sensing circuit comprising:
a magnetic circuit having a magnetic core, a reference winding wound around the magnetic core, and a conductor passing through a center of the magnetic core, the conductor being connected to the electrical line;
a detection circuit connected to the reference winding of the magnetic circuit, wherein the detection circuit is configured to detect a change in a condition of the magnetic core and generate a detection signal in response to a determination of the change, wherein the condition of the magnetic core is at least one of: a saturation condition and a desaturated condition, wherein the detection circuit comprises:
a current source circuit configured to supply a reference current to the reference winding to bias the condition of the magnetic core, wherein the condition of the magnetic core changes to at least one of: the saturation condition and the desaturated condition, based on the reference current and the current in the electrical line; and
a comparator circuit configured to detect a voltage pulse across the reference winding and generate the detection signal in response to the detected voltage pulse, wherein the voltage pulse is generated when the condition of the magnetic core changes from the saturation condition to the desaturated condition; and
a controller coupled to the detection circuit for receiving the detection signal, where the controller is configured to measure the current in the electrical line in response to receiving the detection signal from the detection circuit.

11. The EVSE of claim 10, further comprising an overcurrent protection circuit configured to prevent excessive current from flowing to the EVSE, wherein the overcurrent protection circuit is configured to operate in response to the measured current from the current sensing circuit.

12. The EVSE of claim 11, wherein the overcurrent protection circuit is further configured to:
determine whether the measured current from the current sensing circuit is greater than a configurable threshold supply current; and
interrupt the flow of the current in the EVSE, in response to determining the measured current is greater than the configurable threshold supply current.

13. The EVSE of claim 10, wherein the comparator circuit is further configured to generate the detection signal when the detected voltage pulse is greater than a threshold value.

* * * * *